United States Patent
White et al.

(10) Patent No.: US 10,148,266 B1
(45) Date of Patent: Dec. 4, 2018

(54) DISTRIBUTED CONTROL POLE CLAMP CIRCUIT FOR GATE DRIVER

(71) Applicants: Paul M. White, Sunnyvale, CA (US); Stephen M. Spiteri, Livermore, CA (US); Thomas L. Smith, Hercules, CA (US)

(72) Inventors: Paul M. White, Sunnyvale, CA (US); Stephen M. Spiteri, Livermore, CA (US); Thomas L. Smith, Hercules, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/637,813

(22) Filed: Jun. 29, 2017

Related U.S. Application Data

(60) Provisional application No. 62/358,603, filed on Jul. 6, 2016.

(51) Int. Cl.
*H03K 17/16* (2006.01)
*H03K 17/687* (2006.01)

(52) U.S. Cl.
CPC ....... *H03K 17/6871* (2013.01); *H03K 17/161* (2013.01)

(58) Field of Classification Search
CPC .. H03K 17/161; H03K 17/165; H03K 17/166; H03K 17/167; H03K 17/6871; H03K 17/6877
USPC ....... 327/108, 109, 306, 309, 310, 311, 312, 327/317, 318, 323, 365, 379, 382, 403, 327/404, 405, 419, 427, 432, 434, 478, 327/574, 581
See application file for complete search history.

(56) References Cited

U.S. PATENT DOCUMENTS

| | | |
|---|---|---|
| 3,351,839 A | 11/1967 | Johnson et al. |
| 4,155,047 A | 5/1979 | Rubens et al. |
| 5,175,533 A | 12/1992 | Krenik |
| 5,274,284 A | 12/1993 | Krenik et al. |
| 5,365,126 A | 11/1994 | Krenik et al. |
| 5,465,058 A | 11/1995 | Krenik et al. |
| 5,469,195 A | 11/1995 | Yung et al. |
| 5,668,500 A | 9/1997 | LeFevre |
| 5,936,467 A | 8/1999 | Strickland |
| 6,278,321 B1 | 8/2001 | Franck |
| 6,281,720 B1 | 8/2001 | Bonitz |
| 8,324,876 B1 | 12/2012 | Le et al. |
| 8,373,451 B1 | 2/2013 | Ferguson |
| 8,400,220 B1 | 3/2013 | Joffe et al. |
| 2015/0171852 A1* | 6/2015 | Pang .............. H03K 17/08104 327/109 |
| 2016/0301351 A1* | 10/2016 | Kaneda ............ H03K 17/08122 |

* cited by examiner

*Primary Examiner* — William Hernandez
(74) *Attorney, Agent, or Firm* — Young Basile Hanlon & MacFarlane, P.C.

(57) ABSTRACT

A switching circuit for controlling supply of electrical power from a power pole input to a power pole output.

20 Claims, 3 Drawing Sheets

DISTRIBUTED CONTROL POLE CLAMP CIRCUIT FOR GATE DRIVER

CROSS-REFERENCE TO RELATED APPLICATIONS

This application claims the benefit of U.S. Provisional Application No. 62/358,603, filed on Jul. 6, 2016 and entitled "Distributed Pole Clamp Circuit for Gate Driver," which is incorporated herein in its entirety by reference.

TECHNICAL FIELD

The application relates generally to gate driver circuits.

BACKGROUND

In electronic switching applications, design changes have resulted in increased switching speeds. Design changes to transistors have resulted, in some applications, in higher inductances and/or lower capacitances between the transistor gate and the source while also decreasing the gate resistance internal to the transistor.

SUMMARY

One aspect of the disclosed embodiments is a switching circuit for controlling supply of electrical power from a power pole input to a power pole output. A plurality of transistors are connected in parallel between the power pole input and the power pole output to control supply of electrical power from the power pole input to the power pole output. Each transistor has a control pole, a positive power pole connected to the power pole input, and a negative power pole connected to the power pole output. A gate drive circuit is connected to the control poles of the transistors for supplying one or more gate commands to the transistors for causing turn-on and turn-off of the transistors. A plurality of switching devices are each connected to the control pole of a respective one of the transistors for clamping a control pole voltage of the respective transistor. The switching devices are configured to clamp off the control pole voltage of the respective transistor when a feedback signal is less than a threshold signal and the switching devices are configured to forgo clamping when the feedback signal is greater than the threshold signal.

Another aspect of the disclosed embodiments is a switching circuit for controlling supply of electrical power from a power pole input to a power pole output. The switching circuit includes a plurality of transistors connected in parallel between the power pole input and the power pole output to control supply of electrical power from the power pole input to the power pole output, each transistor having a control pole, a positive power pole connected to the power pole input, and a negative power pole connected to the power pole output. The switching circuit also includes a gate drive circuit connected to the control poles of the transistors for supplying one or more gate commands to the transistors for causing turn-on and turn-off of the transistors. The switching circuit also includes a plurality of switching devices each connected to the control pole of a respective one of the transistors for clamping a control pole voltage of the respective transistor, wherein the switching devices are configured to clamp the control pole voltage of the respective transistor when a feedback signal is less than a threshold signal and the switching devices are configured to forgo clamping when the feedback signal is greater than the threshold signal. The switching circuit also includes split gate resistors that are each connected to the control pole of a respective one of the transistors to damp a resonant path between the control poles of the transistors, wherein the split gate resistors are arranged in parallel with each other. The switching circuit also includes one or more shared gate resistors that are connected in series with the split gate resistors.

Another aspect of the disclosed embodiments is a switching circuit for controlling supply of electrical power from a power pole input to a power pole output. The switching circuit includes a first transistor and a second transistor connected in parallel between the power pole input and the power pole output to control supply of electrical power from the power pole input to the power pole output, and a gate drive circuit connected to the first transistor and the second transistor for causing turn-on and turn-off of the first transistor and the second transistor. The switching circuit also includes a first switching device connected to the first transistor and a second switching device connected to the second transistor to apply clamping to the first transistor and the second transistor when a feedback signal is greater than a threshold. The switching circuit also includes a feedback circuit that sets the feedback signal to the highest of a first control voltage of the first transistor or a second control voltage from the second transistor from the control poles of the transistors.

DETAILED DESCRIPTION

In a transistor (e.g., a MOSFET), a parasitic capacitance may be experienced between the positive power pole and the control pole. This parasitic capacitance is referred to as Miller capacitance. During turn-off of transistors in a high-frequency switching power converter, the Miller capacitance may cause a phenomenon known as Miller coupling, in which current is forced from the input power pole (i.e., the drain of an n-type MOSFET) to the control pole (i.e., the gate of an n-type MOSFET). This effect becomes more pronounced at high switching speeds. In some cases the voltage increase at the control pole resulting from Miller coupling during turn-off can be enough to cause the transistor to turn back on. This may result in multiple turn-on and turn-off events when only one is commanded, leading to higher losses and potential failure of the switch.

A resolution to this issue is to add a circuit called a Miller clamp. After turn-off of the transistor, the Miller clamp connects the control pole of the transistor to the negative power supply of the gate drive circuit of a switching device. By this connection, the Miller clamp shunts injected current through the control pole of the transistor to prevent unintended turn-on.

Figure 1:
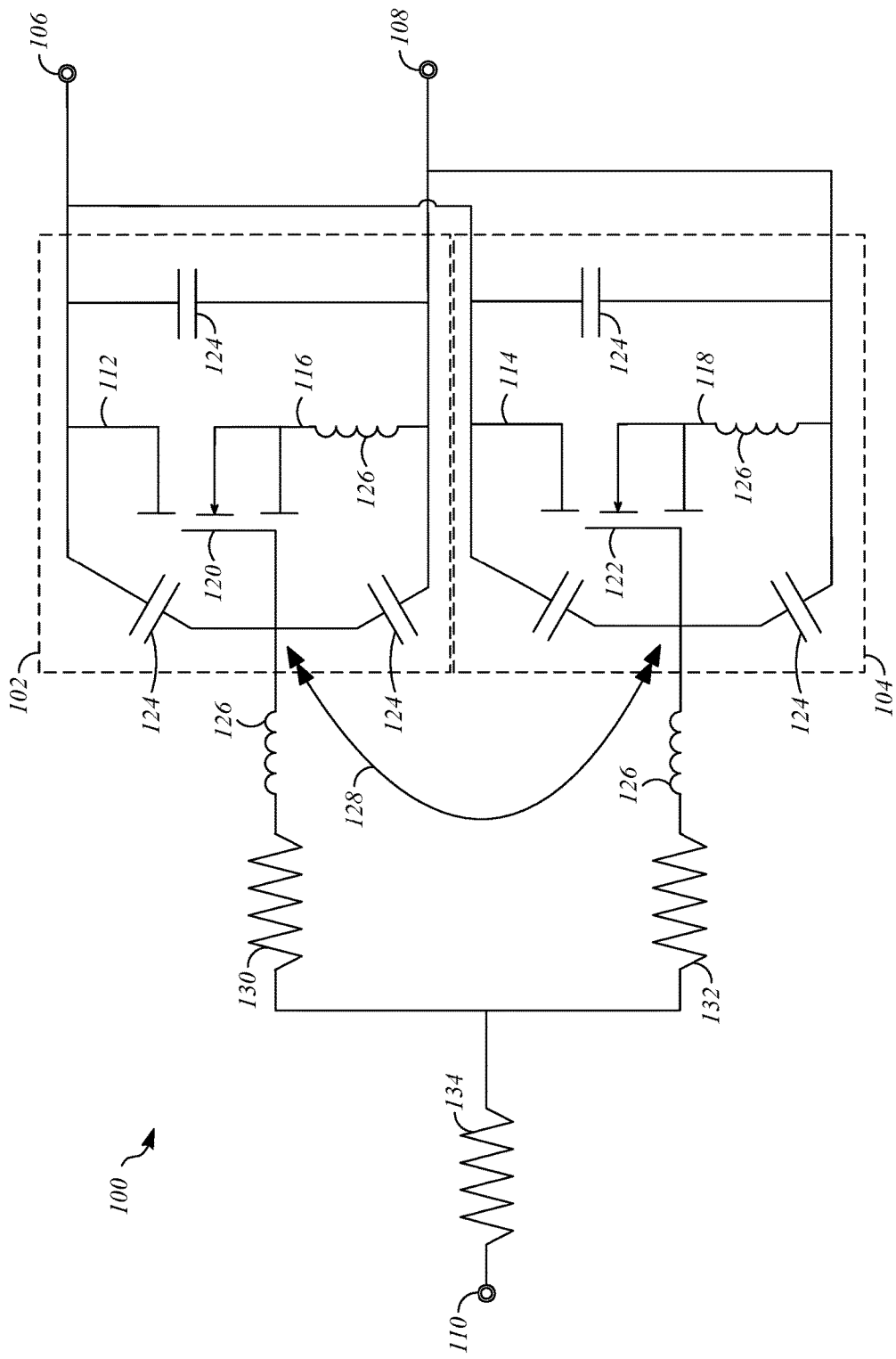
FIG. 1 is an illustration showing an exemplary circuit having parallel transistors.

Power convertor designs may use multiple parallel transistors to obtain additional current capacity. As an example, FIG. 1 shows a circuit 100 that includes a first transistor 102 and a second transistor 104 that are connected in parallel.

The first transistor 102 and the second transistor 104 may be connected between a power pole input 106 and a power pole output 108 to control supply of electrical power from the power pole input 106 and the power pole output 108. During normal operation of the circuit 100, the first transistor 102 and the second transistor 104 turn on and turn off in response to a gate command that is provided at a control pole input 110. As an example, the control pole input 110 may receive the gate command from a gate driver.

In the illustrated example, a first positive power pole 112 of the first transistor 102 and a second positive power pole 114 of the second transistor 104 are connected to the power pole input 106. A first negative power pole 116 of the first transistor 102 and a second negative power pole 118 of the second transistor 104 are connected to the power pole output 108. A first control pole 120 of the first transistor 102 and a second control pole 122 of the second transistor 104 are connected to the control pole input 110.

The first transistor 102 and the second transistor 104 are subject to parasitic capacitances 124 and parasitic inductances 126, which arise from the internal characteristics of the switching devices, as well as external connections such as the power module, packaging, and/or PCBA, or other methods of interconnecting devices. Furthermore, a resonant path 128 can be formed between the first control pole 120 and the second control pole 122. In order to damp the path between the first control pole 120 and the second control pole 122 of the first transistor 102 and the second transistor 104, which are connected in parallel, the circuit 100 includes a first split-gate resistor 130 and a second split-gate resistor 132. The first split-gate resistor 130 is connected between the control pole input 110 and the first control pole 120 of the first transistor 102. The second split-gate resistor 132 is connected between the control pole input 110 and the second control pole 122 of the second transistor 104. A shared-gate resistor 134 may be connected between the control pole input 110 and each of the first split-gate resistor 130 and the second split-gate resistor 132 such that the shared-gate resistor 134 is in series with each of the first split-gate resistor 130 and the second split-gate resistor 132.

The damping effect provided by the first split-gate resistor 130 and the second split-gate resistor 132 is able to reduce the likelihood of un-commanded turn-on and/or turn-off of the first transistor 102 and the second transistor 104 as a result of the resonant tank circuit defined along the resonant path 128. Thus, the circuit 100 improves operation of the first transistor 102 and the second transistor 104 under certain operating conditions. However, use of the first split-gate resistor 130 and the second split-gate resistor 132 raises an issue in that the first positive power pole 112 of the first transistor 102 and the second positive power pole 114 of the second transistor 104, which are in parallel, cannot be connected together, but are instead separated by the first split-gate resistor 130 and the second split-gate resistor 132.

Figure 2:
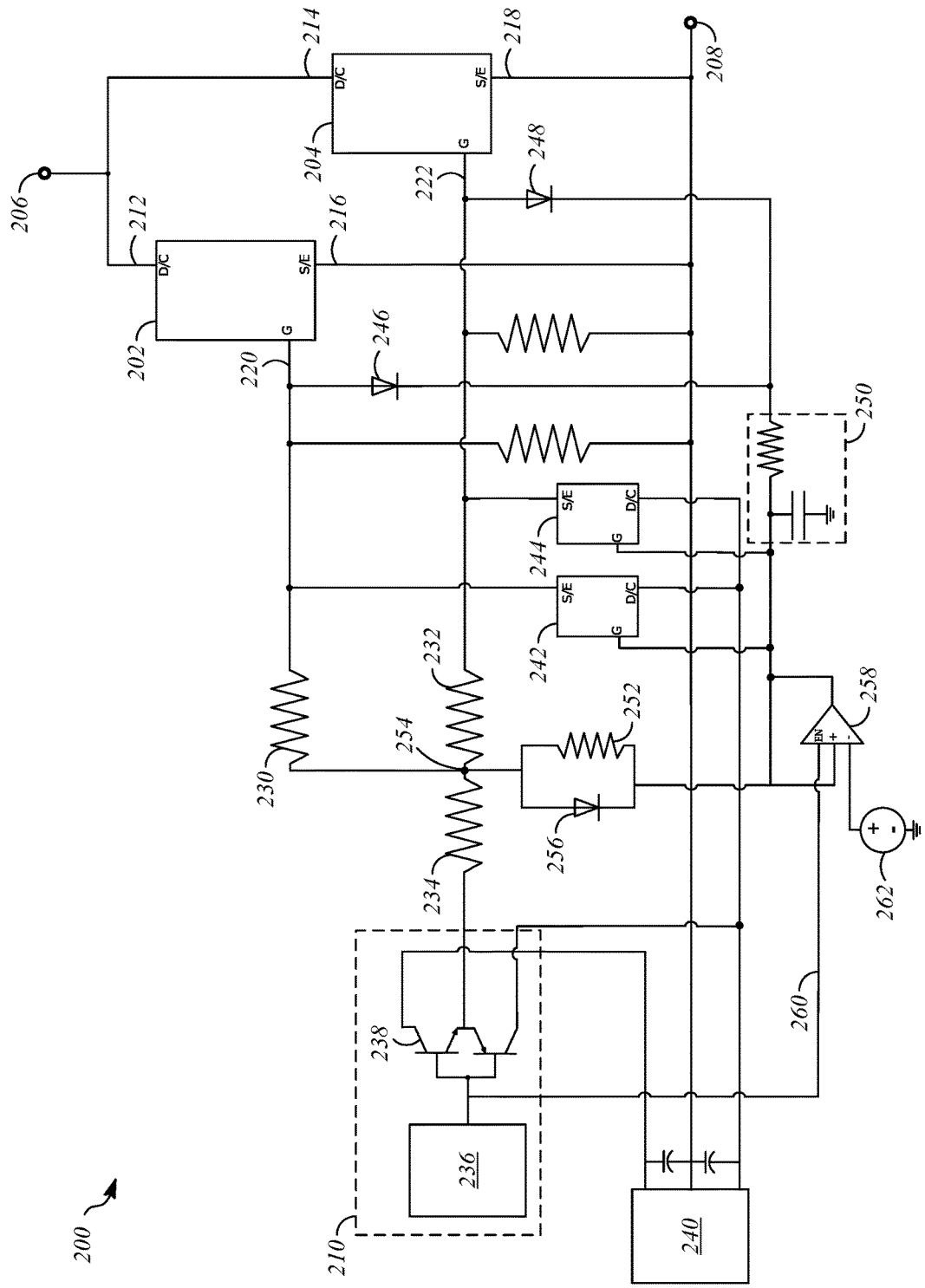
FIG. 2 is an illustration showing an exemplary distributed control pole clamp circuit according to a first example.

FIG. 2 is an illustration showing a circuit 200, which is an exemplary distributed control pole clamp circuit according to a first example. The circuit 200 includes a first transistor 202 and a second transistor 204 that are connected in parallel.

The first transistor 202 and the second transistor 204 may be connected between a power pole input 206 and a power pole output 208 to control supply of electrical power from the power pole input 206 and the power pole output 208 in response to one or more gate commands from a gate drive circuit 210.

The first transistor 202 and the second transistor 204 are illustrative, and it should be understood that the circuit 200 may include additional transistors that are connected in parallel. Thus, the circuit 200 may include a plurality of transistors, such as the first transistor 202 and the second transistor 204, that are connected in parallel between the power pole input 206 and the power pole output 208 to control supply of electrical power from the power pole input 206 to the power pole output 208. Each of the first transistor 202 and the second transistor 204 has a positive power pole, that is connected to the power pole input 206. The first transistor 202 has a first positive power pole 212 that is connected to the power pole input 206. The second transistor 204 has a second positive power pole 214 that is connected to the power pole input 206. Each of the first transistor 202 and the second transistor 204 has a negative power pole that is connected to the power pole output 208. The first transistor 202 has a first negative power pole 216 that is connected to the power pole output 208. The second transistor 204 has a second negative power pole 218 that is connected to the power pole output 208. Each of the first transistor 202 and the second transistor 204 has a control pole. The first transistor 202 has a first control pole 220. The second transistor 204 has a second control pole 222.

The gate drive circuit 210 is indirectly connected to the first control pole 220 of the first transistor 202 and to the second control pole 222 the second transistor 204 for supplying one or more gate commands to the first transistor 202 and the second transistor 204 for causing turn-on and turn-off of the first transistor 202 and the second transistor 204. The gate drive circuit 210 may include a gate drive controller 236 for generating the one or more gate commands and an amplifier 238 for amplifying the one or more gate commands from the gate drive controller 236 using power from a gate drive power supply 240. The amplifier 238 may be a current and/or voltage amplifier. In some embodiments, the amplifier 238 may include two complementary bipolar junction transistors or two complementary field-effect transistors.

The first transistor 202 and the second transistor 204 are subject to parasitic capacitances and parasitic inductances as described with respect to the circuit 100. In order to damp the path between the first control pole 220 and the second control pole 222 of the first transistor 202 and the second transistor 204, which are connected in parallel, the circuit 200 includes a first split-gate resistor 230 and a second split-gate resistor 232. The first split-gate resistor 230 is connected between the gate drive circuit 210 and the first control pole 220 of the first transistor 202. The second split-gate resistor 232 is connected between the gate drive circuit 210 and the second control pole 222 of the second transistor 204. A shared-gate resistor 234 may be connected between the gate drive circuit 210 and each of the first split-gate resistor 230 and the second split-gate resistor 232, such that the shared-gate resistor 234 is in series with each of the first split-gate resistor 230 and the second split-gate resistor 232.

In order to clamp the voltage at the first control pole 220 of the first transistor 202 and the second control pole 222 of the second transistor 204 during turn-off of the first transistor 202 and the second transistor 204, the circuit 200 includes switching devices 200 to control clamping. The switching devices can be provided in a number equal to the number of transistors to control clamping of the control pole voltages, or there can be more than one switching device for each of the transistors. In the illustrated implementation the circuit 200 includes a first switching device 242 and a second switching device 244. The first switching device 242 is connected to the first control pole 220 of the first transistor 202. The second switching device 244 is connected to the second control pole 222 of the second transistor 204.

The first switching device 242 and the second switching device 244 are connected so that the positive power pole of each is connected to a respective one of the first control pole 220 or the second control pole 222 of the first transistor 202 and the second transistor 204. The negative power pole of each of the first switching device 242 and the second switching device 244 is connected to the negative terminal of the gate drive power supply 240, the ground of the gate drive power supply 240, or to a separate power supply that is creating a voltage lower than the voltage at these points. The first switching device 242 and the second switching device 244 can be, but are not limited to, metal-oxide-semiconductor field-effect transistors (MOSFETs), insulated-gate bipolar transistors (IGBTs), junction (gate) field-effect transistors (JFETs), integrated gate-commutated thyristors (IGCTs), high-electron-mobility transistors (HEMTs) (also known as modulation-doped field-effect transistors (MODFETs) or heterostructure field-effect transistors (HFETs)), metal-semiconductor field-effect transistors (MESFETs), bipolar junction transistors (BJTs), ballistic connection transistors (BCTs), gate turn-off thyristors (GTOs), and similar types of devices, either N-type or P-type. Moreover, such transistors or thyristors may be fabricated using, for example, homoepitaxial Si, homoepitaxial SiC, homoepitaxial GaN, homoepitaxial gallium arsenide (GaAs), heteroepitaxial GaN-on-Si, heteroepitaxial GaN-on-SiC, or any other similar crystalline overlayer on a crystalline substrate combination. All of the devices listed above may be depletion mode devices or enhancement mode devices.

The first switching device 242 and the second switching device 244 are configured to switch on and switch off clamping of the control pole voltages of the first transistor 202 and the second transistor 204. Operation of the first switching device 242 and the second switching device 244 is controlled such that the first switching device 242 and the second switching device 244 turn on and apply clamping during turn-off of the first transistor 202 and the second transistor 204 when a feedback signal is less than a threshold signal, and such that the first switching device 242 and the second switching device 244 turn off and forgo clamping when the feedback signal is greater than the threshold signal. Control of the first switching device 242 and the second switching device 244, including generation of the feedback signal and the threshold signal, will be described herein.

The circuit 200 includes a feedback circuit for providing the feedback signal from the first transistor 202 and the second transistor 204. The feedback signal is dependent on voltage from the first control pole 220 of the first transistor 202 and the second control pole 222 of the second transistor 204. Thus, the feedback circuit is connected to the first control pole 220 of the first transistor 202 and the second control pole 222 of the second transistor 204. In the illustrated example, the feedback circuit includes a first feedback diode 246 and a second feedback diode 248 that are arranged in parallel with one another. Each of the first feedback diode 246 and the second feedback diode 248 is associated with one of the first transistor 202 and the second transistor 204. Additional feedback diodes are incorporated in the feedback circuit when additional transistors are included in the circuit 200.

The anode of the first feedback diode 246 is connected to the first control pole 220 of the first transistor 202 between the first transistor 202 and the first split-gate resistor 230. The anode of the second feedback diode 248 is connected to the second control pole 222 of the second transistor 204 between the second transistor 204 and the second split-gate resistor 232. The cathodes of the first feedback diode 246 and the second feedback diode 248 are connected together at a central point that represents the highest voltage seen on any of the first control pole 220 of the first transistor 202 and the second control pole 222 of the second transistor 204. As a result of the configuration of the first feedback diode 246 and the second feedback diode 248, the feedback signal is set to a highest voltage from the first control pole 220 of the first transistor 202 and the second control pole 222 of the second transistor 204.

The feedback circuit may include a filter 250 to remove noise from the feedback signal. The filter 250 may incorporate one or more resistors, inductors, and/or capacitors. Thus, the filter 250 may remove noise from an unfiltered feedback signal, resulting in a filtered feedback signal. Unless otherwise stated, use of the term "feedback signal" may refer to the unfiltered feedback signal or the filtered feedback signal.

At least one of a resistor 252 or a capacitor may be connected between the gate command and the feedback signal. As an example, the resistor 252 may be connected to receive the gate command at a node 254 between the shared-gate resistor 234 and the first split-gate resistor 230 and the second split-gate resistor 232. The resistor 252 may be connected to receive the feedback signal at locations such as on either side of the filter 250.

A hot-start diode 256 may be included in the circuit 200 for advance biasing an input voltage for the first switching device 242 and the second switching device 244. In the illustrated example the anode of the hot-start diode 256 is connected to node 254 and the cathode of the hot-start diode 256 is connected to the gates of the first switching device 242 and the second switching device 244. Optionally, resistors or inductors may be placed in series with the hot-start diode 256.

The circuit 200 includes a comparator 258 for comparing the feedback signal to the threshold signal. The comparator 258 may be able to switch between states, such as by changing between an enabled state and a disabled state in response to the one or more gate commands. In the illustrated implementation, the enabled or disabled state of the comparator 258 is controlled by an unamplified gate command received from the gate drive controller 236 over a connection 260. The comparator 258 may receive the threshold signal from a threshold voltage source 262 that is connected to the comparator 258. The threshold voltage source 262 controls the point where clamping engages, and the voltage provided by the threshold voltage source 262 may be positive or negative. In some embodiments, the voltage provided by the threshold voltage source can be set according to the operating point (e.g., gate drive voltage and/or power pole current) of the first transistor 202 and the second transistor 204.

During turn-off of the power pole output 208, the gate command from the gate drive controller 236 is switched from high to low. The capacitive elements of the first control pole 220 of the first transistor 202 and the second control pole 222 of the second transistor 204 are discharged through the shared-gate resistor 234 and the first split-gate resistor 230 and the second split-gate resistor 232. The comparator 258 is enabled in response to the gate command switching from high to low.

The resistor 252 consumes current from node the feedback signal, while the first feedback diode 246 and the second feedback diode 248 clamp the voltage of the feedback signal to the highest voltage seen at the first control pole 220 of the first transistor 202 and the second control pole 222 of the second transistor 204.

When the voltage of the feedback signal falls below the voltage of the threshold signal, the voltage of the feedback signal is set by the comparator 258 to the negative voltage of the gate drive power supply 240, the ground of the gate drive power supply 240, or the voltage of a separate power supply that is creating a voltage lower than these points. At this point, the first switching device 242 and the second switching device 244 are turned on.

As the first transistor 202 and the second transistor 204 turn off, current is injected onto first control pole 220 of the first transistor 202 and the second control pole 222 of the second transistor 204 via Miller Coupling. Since the first switching device 242 and the second switching device 244 are turned on, current flows through the low-resistance path of provided by the first switching device 242 and the second switching device 244 instead of through the higher resistance path of the first split-gate resistor 230 and the second split-gate resistor 232 and the shared-gate resistor 234.

During turn-on of the power pole output 208, the gate command from the gate drive controller 236 is switched from low to high. The capacitive elements of the first control pole 220 of the first transistor 202 and the second control pole 222 of the second transistor 204 are charged through the shared-gate resistor 234 and the first split-gate resistor 230 and the second split-gate resistor 232. The comparator 258 is disabled in response to the gate command switching from low to high.

Current will flow through the first feedback diode 246 and the second feedback diode 248 to turn off the first switching device 242 and the second switching device 244. Current may also flow through the hot-start diode 256 to turn off the first switching device 242 and the second switching device 244. Once the first switching device 242 and the second switching device 244 are turned off, the circuit 200 can continue to turn on as normal in order to provide electrical power from the power pole input 206 to the power pole output 208.

Figure 3:
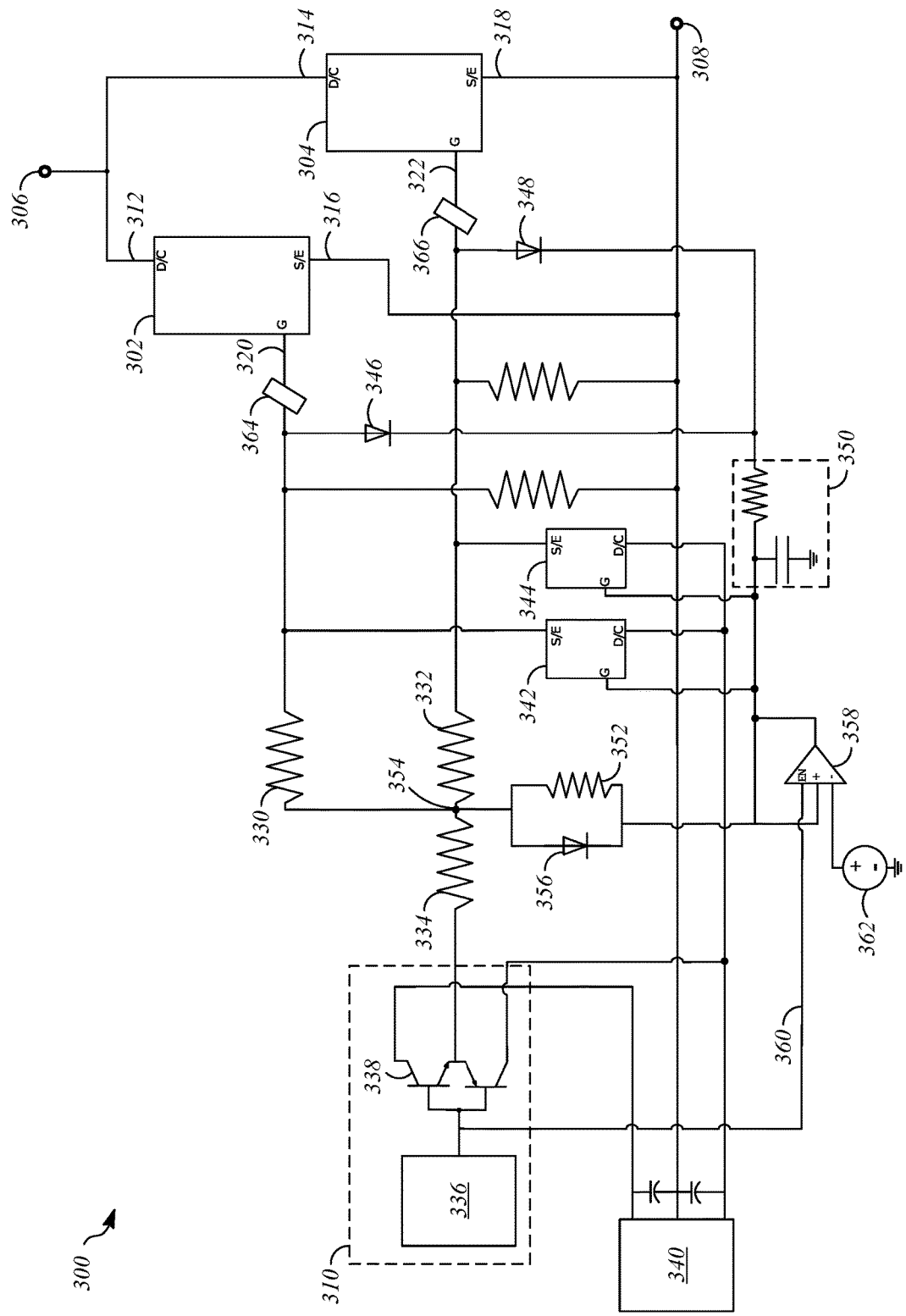
FIG. 3 is an illustration showing an exemplary distributed control pole clamp circuit according to a second example.

FIG. 3 is an illustration showing a circuit 300, which is an exemplary distributed control pole clamp circuit according to a second example. The circuit 300 is similar to the circuit 200 except as described herein, with similarly named parts functioning in the previously-described manner.

The circuit 300 includes a first transistor 302 and a second transistor 304 that are connected in parallel between a power pole input 306 and a power pole output 308, to control supply of electrical power based on gate commands from a gate drive circuit 310. The first transistor 302 has a first positive power pole 312, a first negative power pole 316, and a first control pole 320. The second transistor 304 has a second positive power pole 314, a second negative power pole 318, and a second control pole 322. A first split-gate resistor 330 is connected between the gate drive circuit 310 and the first control pole 320. A second split-gate resistor 332 is connected between the gate drive circuit 310 and the second control pole 322. A shared-gate resistor 334 is connected in series with the first split-gate resistor 330 and the second split-gate resistor 332.

The gate drive circuit 310 has a gate drive controller 336 and an amplifier 338. The amplifier 338 of the gate drive circuit 310 is powered by a gate drive power supply 340.

A first switching device 342 is connected to the first control pole 320 of the first transistor 302 and a second switching device 344 is connected to the second control pole 322 of the second transistor 304 to apply clamping during turn-off in the manner described with respect to the first switching device 242 and the second switching device 244 of the circuit 200. The first switching device 342 and the second switching device 344 are controlled by a feedback signal from a feedback circuit that includes a first feedback diode 346, a second feedback diode 348, and a filter 350.

A resistor 352 or a capacitor may be connected between the gate command at node 354 and the feedback signal, for example, on either side of the filter 350. A hot-start diode 356 may be included in the circuit 300 for advance biasing an input voltage for the first switching device 342 and the second switching device 344.

The circuit 300 includes a comparator 358 for comparing the feedback signal to the threshold signal, with an enabled or disabled state of the comparator 358 being controlled by an unamplified gate command received from the gate drive controller 336 over a connection 360, which is compared to a threshold signal from a threshold voltage source 362.

The circuit 300 includes a first inductor such as a first ferrite bead 364 and a second inductor such as a second ferrite bead 366. The first ferrite bead 364 is located at the first control pole 320 of the first transistor 302. The first ferrite bead 364 can be in series with the first control pole 320, for example, between the first control pole 320 and the first split-gate resistor 330. The second ferrite bead 366 is located at the second control pole 322 of the second transistor 304. The second ferrite bead 366 can be in series with the second control pole 322, for example, between the second control pole 322 and the second split-gate resistor 332.

By applying an inductance at the first control pole 320, the first ferrite bead 364 functions to reduce unintended signal oscillations (e.g., oscillations in voltage and/or current) between the first control pole 320 of the first transistor 302 and the first switching device 342. By applying an inductance at the second control pole 322, the second ferrite bead 366 functions to reduce unintended signal oscillations between the second control pole 322 of the second transistor 304 and the second switching device 344.

The circuit 200 and the circuit 300 may be employed in a broad range of devices. As one example the circuit 200 and the circuit 300 are applicable to power convertors of any kind. As further examples, the circuit 200 and the circuit 300 may be utilized in DC/DC convertors such as wireless power transfer convertors, isolated convertors, or point of load convertors. As further examples, the circuit 200 and the circuit 300 may be used in variable frequency drives, such as variable frequency drive driven pump and fan inverters, motor inverters, wind generator inverters, solar photovoltaic inverters, and uninterruptible power supplies.

What is claimed is:

1. A switching circuit for controlling supply of electrical power from a power pole input to a power pole output, comprising:

a plurality of transistors connected in parallel between the power pole input and the power pole output to control supply of electrical power from the power pole input to the power pole output, each transistor having a control pole, a positive power pole connected to the power pole input, and a negative power pole connected to the power pole output;

a gate drive circuit connected to the control poles of the transistors for supplying one or more gate commands to the transistors for causing turn-on and turn-off of the transistors; and a plurality of switching devices each connected to the control pole of a respective one of the transistors for clamping a control pole voltage of the respective transistor, wherein the switching devices are configured to clamp the control pole voltage of the respective transistor when a feedback signal is less than a threshold signal and the switching devices are configured to forgo clamping when the feedback signal is greater than the threshold signal.

2. The switching circuit of claim 1, wherein the feedback signal is dependent on voltage from the control poles of the transistors.

3. The switching circuit of claim 2, further comprising:
a feedback circuit for providing the feedback signal from the transistors, wherein the feedback circuit is connected to the control pole of each of the transistors.

4. The switching circuit of claim 3, wherein the feedback circuit sets the feedback signal to a highest voltage from the control poles of the transistors.

5. The switching circuit of claim 4, wherein the feedback circuit includes feedback diodes that are each associated with the control pole of a respective one of the transistors.

6. The switching circuit of claim 5, wherein the feedback diodes are arranged in parallel with one another.

7. The switching circuit of claim 6, wherein the feedback circuit includes a filter.

8. The switching circuit of claim 1, further comprising:
a comparator for comparing the feedback signal to the threshold signal.

9. The switching circuit of claim 8, wherein the comparator changes between an enabled state and a disabled state in response to the one or more gate commands.

10. The switching circuit of claim 9, further comprising:
a threshold voltage source connected to the comparator for providing the threshold signal.

11. The switching circuit of claim 1, further comprising:
at least one of a resistor or a capacitor connected between the one or more gate commands and the feedback signal.

12. The switching circuit of claim 11, further comprising:
a hot-start diode for advance biasing an input voltage for the switching devices.

13. The switching circuit of claim 1, further comprising:
a plurality of split-gate resistors each connected to the control pole of a respective one of the transistors to damp a resonant path between the control poles of the transistors.

14. The switching circuit of claim 13, wherein the split-gate resistors are arranged in parallel with each other.

15. The switching circuit of claim 14, further comprising:
one or more shared-gate resistors connected in series with the split-gate resistors.

16. The switching circuit of claim 15, wherein the one or more shared-gate resistors are connected between the gate drive circuit and the split-gate resistors.

17. The switching circuit of claim 1, wherein the gate drive circuit further comprises:
a gate drive controller that generates the one or more gate commands, and an amplifier that amplifies the one or more gate commands.

18. The switching circuit of claim 1, further comprising:
an inductance applied at each of the control poles to reduce oscillations.

19. A switching circuit for controlling supply of electrical power from a power pole input to a power pole output, comprising:
a plurality of transistors connected in parallel between the power pole input and the power pole output to control supply of electrical power from the power pole input to the power pole output, each transistor having a control pole, a positive power pole connected to the power pole input, and a negative power pole connected to the power pole output;
a gate drive circuit connected to the control poles of the transistors for supplying one or more gate commands to the transistors for causing turn-on and turn-off of the transistors;
a plurality of switching devices each connected to the control pole of a respective one of the transistors for clamping a control pole voltage of the respective transistor, wherein the switching devices are configured to clamp the control pole voltage of the respective transistor when a feedback signal is less than a threshold signal and the switching devices are configured to forgo clamping when the feedback signal is greater than the threshold signal;
split gate resistors each connected to the control pole of a respective one of the transistors to damp a resonant path between the control poles of the transistors, wherein the split gate resistors are arranged in parallel with each other; and
one or more shared gate resistors connected in series with the split gate resistors.

20. A switching circuit for controlling supply of electrical power from a power pole input to a power pole output, comprising:
a first transistor and a second transistor connected in parallel between the power pole input and the power pole output to control supply of electrical power from the power pole input to the power pole output;
a gate drive circuit connected to the first transistor and the second transistor for causing turn-on and turn-off of the first transistor and the second transistor;
a first switching device connected to the first transistor and a second switching device connected to the second transistor to apply clamping to the first transistor and the second transistor when a feedback signal is greater than a threshold; and
a feedback circuit that sets the feedback signal to the highest of a first control voltage of the first transistor or a second control voltage of the second transistor from the control poles of the transistors.

* * * * *